(12) United States Patent
Wolfe et al.

(10) Patent No.: US 10,827,610 B2
(45) Date of Patent: Nov. 3, 2020

(54) ARTICLES AND SUBSTRATES PROVIDING IMPROVED PERFORMANCE OF PRINTABLE ELECTRONICS

(71) Applicant: E I DU PONT DE NEMOURS AND COMPANY, Wilmington, DE (US)

(72) Inventors: Michael Stephen Wolfe, Wilmington, DE (US); H David Rosenfeld, Drumore, PA (US); Robin Kobren, Riegelsville, PA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 408 days.

(21) Appl. No.: 15/805,226

(22) Filed: Nov. 7, 2017

(65) Prior Publication Data

US 2018/0132350 A1    May 10, 2018

Related U.S. Application Data

(60) Provisional application No. 62/418,338, filed on Nov. 7, 2016.

(51) Int. Cl.
*H05K 1/03* (2006.01)
*H05K 1/09* (2006.01)
(Continued)

(52) U.S. Cl.
CPC ............. *H05K 1/036* (2013.01); *B05D 3/007* (2013.01); *B05D 3/144* (2013.01); *C08J 7/042* (2013.01); *C08J 7/0427* (2020.01); *H05K 1/095* (2013.01); *H05K 3/1208* (2013.01); *H05K 3/1216* (2013.01); *C08J 7/043* (2020.01);
(Continued)

(58) Field of Classification Search
CPC ........ B60C 2013/045; C08J 7/04–7/044; C08J 7/024; C08J 7/0247; C08J 2300/26; C08J 2400/26; H05K 1/036; H05K 1/095; H05K 2201/0129; H05K 2201/0133; H05K 2201/0314; H05K 2201/05–2201/058; H05K 2203/0759; H05K 3/1208;
(Continued)

(56) References Cited

U.S. PATENT DOCUMENTS 3,914,478 A * 10/1975 Johansson .............. C08J 7/0427
427/393.5
6,703,114 B1 * 3/2004 Guiles ...................... B32B 5/18
428/209
(Continued)

FOREIGN PATENT DOCUMENTS

EP    3035771 A1    6/2016
EP    3145283 A1    3/2017
(Continued)

OTHER PUBLICATIONS

International Search Report, PCT/US2017/059258, Mohr Ferro Vasconcelos, Monica, Authorized Officer, EPO, 26022018.

*Primary Examiner* — Ramsey Zacharia

(57) ABSTRACT

This invention is directed to substrates and articles utilizing these substrates that provide improved performance of printable electronics on polymer substrates. In particular, the improved substrates relate to polymer films and electrical conductors printed on them. Application of a thin polymeric coating to the polymer film provides the improved performance of the printed conductors.

6 Claims, 2 Drawing Sheets

(51) Int. Cl.
*C08J 7/043* (2020.01)
*C08J 7/044* (2020.01)
*B05D 3/02* (2006.01)
*B05D 3/14* (2006.01)
*C08J 7/04* (2020.01)
*H05K 3/12* (2006.01)
*B05D 3/00* (2006.01)

(52) U.S. Cl.
CPC ............ *C08J 7/044* (2020.01); *C08J 2300/26* (2013.01); *C08J 2400/26* (2013.01); *H05K 2201/0129* (2013.01); *H05K 2201/0133* (2013.01); *H05K 2201/0195* (2013.01); *H05K 2201/0314* (2013.01); *H05K 2203/0759* (2013.01); *H05K 2203/095* (2013.01)

(58) Field of Classification Search
CPC ......... H05K 3/1216; H05K 2201/0195; H05K 2203/095; B05D 3/007; B05D 3/144
See application file for complete search history.

(56) References Cited

U.S. PATENT DOCUMENTS

| | | | |
|---|---|---|---|
| 2013/0034725 A1* | 2/2013 | Paul | B32B 7/12 428/341 |
| 2013/0240104 A1* | 9/2013 | Le Clerc | B60C 9/14 152/525 |
| 2015/0366323 A1* | 12/2015 | Bouix | H05B 3/34 206/581 |

FOREIGN PATENT DOCUMENTS

| | | |
|---|---|---|
| WO | 2009/086246 A1 | 7/2009 |
| WO | 20121028686 A2 | 3/2012 |
| WO | 20151174505 A1 | 11/2015 |
| WO | 20161073465 A1 | 5/2016 |
| WO | 20161145309 A1 | 9/2016 |

* cited by examiner

ARTICLES AND SUBSTRATES PROVIDING IMPROVED PERFORMANCE OF PRINTABLE ELECTRONICS

FIELD OF THE INVENTION

This invention is directed to substrates and articles utilizing these substrates that provide improved performance of printable electronics on polymer substrates. In particular, the improved substrates relate to polymer films and electrical conductors printed on them. These articles may be used in applications where significant stretching is required, for example in wearable garments

BACKGROUND OF THE INVENTION

Conductive and dielectric inks for printable electronics are sensitive to the substrate on which they are printed. Surface smoothness, surface energy and substrate compatibility with ink solvents can all influence conductivity or insulating behavior of as-printed circuit materials. They can also compromise adhesion and wash-fastness of the printed electronics. There is a need to improve print quality on polymer substrate films.

SUMMARY OF THE INVENTION

This invention provides an article containing an electrical conductor, the article comprising:
  a) an elastomer or thermoplastic elastomer polymer film;
  b) an elastomer or thermoplastic elastomer coating on one side of the polymer film, wherein there is between 1 and 50 g of coating per square meter of polymer film and wherein the coating has been formed from either a solvent solution or a water-based dispersion; and
  c) an elastic, electrical conductor deposited on the coating.

In an embodiment of the above article, the polymer of the thermoplastic elastomer polymer film is selected from the group consisting of thermoplastic polyurethane, thermoplastic polyester and thermoplastic polyether and the thermoplastic elastomer coating is a thermoplastic urethane coating formed from a water-based thermoplastic urethane dispersion.

In one embodiment, the side of the polymer film without the coating is adhered to a carrier film comprising polypropylene, polyethylene terephthalate (PET), silicone treated paper, polypropylene, a polypropylene/polyethylene copolymer or polyvinyl fluoride.

This invention also provides a method for preparing an article containing a printed electrical circuit, the method comprising:
  a) providing an elastomer or thermoplastic elastomer polymer film;
  b) using a solvent solution of or a water-based dispersion of an elastomer or thermoplastic elastomer to deposit a coating onto one side of the polymer film wherein there is between 1 and 50 g of coating per square meter of polymer film; and
  c) depositing an elastic conductive ink on the coating and drying the elastic conductive ink to form the printed circuit.

The invention further provides a method for preparing an article containing a printed electrical circuit, the method comprising:
  a) providing a carrier film comprising polypropylene, a polypropylene/polyethylene copolymer or polyvinyl fluoride;
  b) attaching one side of an elastomer or thermoplastic elastomer polymer film to the carrier film;
  c) using a solvent solution of or a water-based dispersion of an elastomer or thermoplastic elastomer to deposit a coating onto the other side of the polymer film wherein there is between 1 and 50 g of coating per square meter of polymer film;
  d) depositing an elastic conductive ink on the coating and drying the elastic conductive ink to form the printed circuit.

In one embodiment, the method above, further comprises:
  e) removing the carrier from the polymer film.

The invention also provides a composite substrate comprising:
  a) an elastomer or thermoplastic elastomer polymer film; and
  b) an elastomer or thermoplastic elastomer coating on one side of the polymer film, wherein there is between 1 and 50 g of coating per square meter of polymer film and wherein the coating has been formed from either a solvent solution or a water-based dispersion.

In one embodiment of the above composite substrate, the polymer of the thermoplastic elastomer polymer film is selected from the group consisting of thermoplastic polyurethane, thermoplastic polyester and thermoplastic polyether.

In one embodiment, the invention provides a composite substrate comprising:
  a) a polymer film, wherein the polymer is selected from the group selected consisting of thermoplastic polyurethane, thermoplastic polyester and thermoplastic polyether; and
  b) a polyurethane coating on one side of the polymer film, wherein there is between 1 and 50 g of polyurethane coating per square meter of polymer film and wherein the polyurethane coating has been formed from a water-based polyurethane dispersion.

In another embodiment, the invention provides a composite substrate comprising:
  a) a polymer film, wherein the polymer is selected from the group selected consisting of thermoplastic polyurethane, thermoplastic polyester and thermoplastic polyether; and
  b) a polyurethane coating on one side of the polymer film, wherein there is between 1 and 50 g of polyurethane coating per square meter of polymer film and wherein the polyurethane coating has been formed from an organic solvent-based polyurethane solution.

In some embodiments of the above article, method and substrate, the polymer film has been subjected to a corona or plasma treatment prior to the deposition of the coating.

DETAILED DESCRIPTION OF INVENTION

Figure 1A:
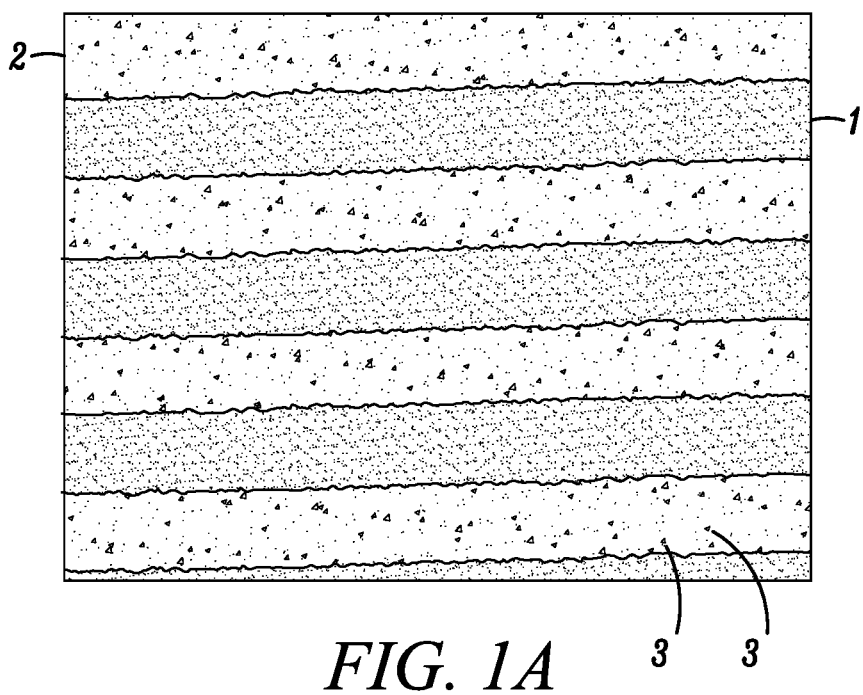
FIG. 1A shows strips of silver paste printed and cured on an untreated thermoplastic polyurethane film substrate.

The invention relates to an article containing an electrical conductor or electrical circuit with improved electrical properties and to composite substrates that make these improvements possible. These articles and substrates may be used in various application but are especially useful for stretchable circuits such as those applications where functional circuitry is generated on fabrics, e.g., for wearable garments. A layer of conductor is printed and dried on a substrate so as to produce a functioning circuit and then the entire circuit is subjected to the typical bending/creasing that a fabric would receive. Additionally, as is typical for fabrics, they must be washed and dried on a periodic basis and the conductivity and integrity of the conductor must be maintained.

The invention overcomes three deficiencies of thermoplastic and elastomeric film substrates. It reduces or eliminates damage to the substrate from solvents in the inks used to print electronics on the substrate. It improves adhesion of the printed electronics to the substrate which affects durability and wash ability. And it reduces surface roughness.

Application of a thin polymeric coating to the polymer film substrate prior to the printing of electronics on the substrate results in a composite substrate with a surface that is more compatible with inks for printing electronics while maintaining the desired mechanical and thermal bulk properties of the untreated polymer film substrate.

The composite substrate comprises an elastomer or thermoplastic elastomer polymer film; and an elastomer or thermoplastic elastomer coating on one side of the polymer film, wherein there is between 1 and 50 g of coating per square meter of polymer film and wherein the coating has been formed from either a solvent solution or a water-based dispersion. As used herein, "treated substrate", "treated surface" or "treated" all refer to a "composite substrate" and "untreated substrate", "untreated surface" or "untreated" all refer to a substrate without an elastomer or thermoplastic elastomer coating.

In one embodiment the composite substrate comprises a polymer film, wherein the polymer is selected from the group consisting of thermoplastic polyurethane (TPU), thermoplastic polyester and thermoplastic polyether; and a polyurethane coating on one side of the polymer film, wherein there is between 1 and 50 g of polyurethane coating per square meter of polymer film and wherein the polyurethane coating has been formed from a water-based polyurethane dispersion.

One polymer for the polymer film is thermoplastic polyurethane (TPU), such as Covestro PT6410S available from Covestro, Pittsburgh, Pa. and Bemis ST-604 available from Bemis Associates, Inc., Shirley, Mass. Another polymer is thermoplastic polyester, such as DuPont™ Hytrel® available from the DuPont Co., Wilmington, Del.

The coating is a polymeric coating with elastic properties similar to those of the polymer film to which it is applied. It may be applied immediately following a corona or plasma treatment to improve wetting of the polymer film surface or it may be applied without the corona or plasma preconditioning of the polymer film surface. The coating may be formed from a water-based polymer dispersion or a solvent-based polymer solution. There is between 1 and 50 g of coating per square meter of polymer film. The coating is cured at temperatures between 120° C. and 250° C. depending on the polymer film.

In one embodiment of the composite substrate, the side of the polymer film without the coating is adhered to a carrier film comprising polypropylene, polyethylene terephthalate (PET), silicone treated paper, polypropylene, a polypropylene/polyethylene copolymer or polyvinyl fluoride. The carrier film provides mechanical support for the polymer film and makes it easier to handle. It is especially important when using polymer films of thickness less than about 0.003 in (80 μm). The adhesive used to adhere the polymer film to the carrier must be such that the carrier can be removed after the electrical circuit or conductor has been formed on the composite substrate.

The invention provides an article comprising an elastomer or thermoplastic elastomer polymer film, an elastomer or thermoplastic elastomer coating on one side of the polymer film, wherein there is between 1 and 50 g of coating per square meter of polymer film and wherein the coating has been formed from either a solvent solution or a water-based dispersion and an elastic, electrical conductor deposited on the coating.

An electrical conductor or circuit is deposited onto the coating of the composite substrate. Typically, this circuit is applied using a polymer thick film silver conductor composition referred to as an ink or paste. The polymer portion of the organic medium of the polymer thick film silver conductor composition remains as an integral part of the conductor composition after drying. Herein, circuit and conductor are used interchangeably to describe the electrically conductive entity that is deposited and formed on the coating. Improved printability of the conductor on the composite substrate versus that on the uncoated polymer film is demonstrated by lower as-printed resistivity on the composite substrate as well as the absence of solvent swelling or surface blistering associated with chemical attack of the polymer film by ink solvents.

Printed conductors of polymer thick film silver ink showed 40% to as much as 70% reductions in resistivity when printed on the composite substrate of DuPont™ Hytrel® 3078 coated with polyurethane as compared to those printed directly on DuPont™ Hytrel® 3078. Resistivity of a single coating of printed ink was stable for conductors printed on the composite substrate while those printed directly on Hytrel® 3078 showed unstable resistivity until two or three coatings were applied. In addition, with the composite substrate there was no evidence of ink solvent damage. No swelling or blistering was observed.

Polymer thick film silver ink did not print well directly on TPU Covestro PT6410S. When printed on the composite substrate of Covestro PT6410S coated with polyurethane the resistance was lowered 70% compared to that printed directly on Covestro PT6410S.

EXAMPLES AND COMPARATIVE EXPERIMENTS

Example 1 and Comparative Experiment A

For Example 1, a 2 mil film of DuPont™ Hytrel® 3078 TPC-ET was mounted on a PET carrier using a low tack adhesive. The exposed side of the DuPont™ Hytrel® film was subjected to a corona treatment of 5 kw/cm$^2$ and an aqueous-based dispersion was used to apply a polyurethane coating at a rate of 4 g of coating per square meter of DuPont™ Hytrel® film using a drawbar. The coating was cured at between 80° C. and 110° C. for 30 seconds. DuPont™ PE873 conductive, elastic silver paste was screen printed onto the treated surface and cured at 130° C. for 15 min. Thickness and resistance were measured and resistivity was calculated as 33 mohm/sq/mil.

Comparative Experiment A was carried out as described for Example 1 except that untreated DuPont™ Hytrel® film was used, i.e. there was no corona treatment or polyurethane coating. The resistivity for the same silver paste screen printed on the untreated DuPont™ Hytrel® 3078 was 65 mohm/sq/mil Example 2 and Comparative Experiment B For Example, 2, a 1 mil film of an ester based, high stretch recovery thermoplastic polyurethane with a durometer of 74 A, and a melt point of 150° C. was mounted on a polypropylene carrier with a 3 mil melt adhesive. The exposed surface of the polyurethane film was subjected to a corona treatment of 5 kw/cm$^2$ and an aqueous-based dispersion was used to apply a polyurethane coating at a rate of 1 g of coating per square meter of polyurethane film in a roll-to-roll process. The coating was cured at between 80° C. and 110° C. for 30 seconds. DuPont™ PE873 conductive, elastic silver paste was screen printed onto the treated surface and cured at 130° C. for 15 min. Thickness and resistance were measured and resistivity was calculated as 22 mohm/sq/mil.

Comparative Experiment B was carried out as described for Example 2 except that untreated polyurethane film was used, i.e. there was no corona treatment or polyurethane coating. The resistivity for the same silver paste screen printed on the untreated polyurethane was 51 mohm/sq/mil.

Example 3 and Comparative Experiment C

For Example 3, a 3 mil film of an ether based, high stretch recovery thermoplastic polyurethane with a durometer of 71 A, and a minimum softening point of 140° C. was mounted on a silicone treated paper carrier with a 1 mil melt adhesive. The exposed surface of the polyurethane film was subjected to a corona treatment of 5 kw/cm$^2$ and an aqueous-based dispersion was used to apply a polyurethane coating at a rate of 1 g of coating per square meter of polyurethane film in a roll-to-roll process. The coating was cured at between 80° C. and 110° C. for 30 seconds. DuPont™ PE873 conductive, elastic silver paste was screen printed onto the treated surface and cured at 130° C. for 15 min. Thickness and resistance were measured and resistivity was calculated as 58 mohm/sq/mil.

Figure 1B:
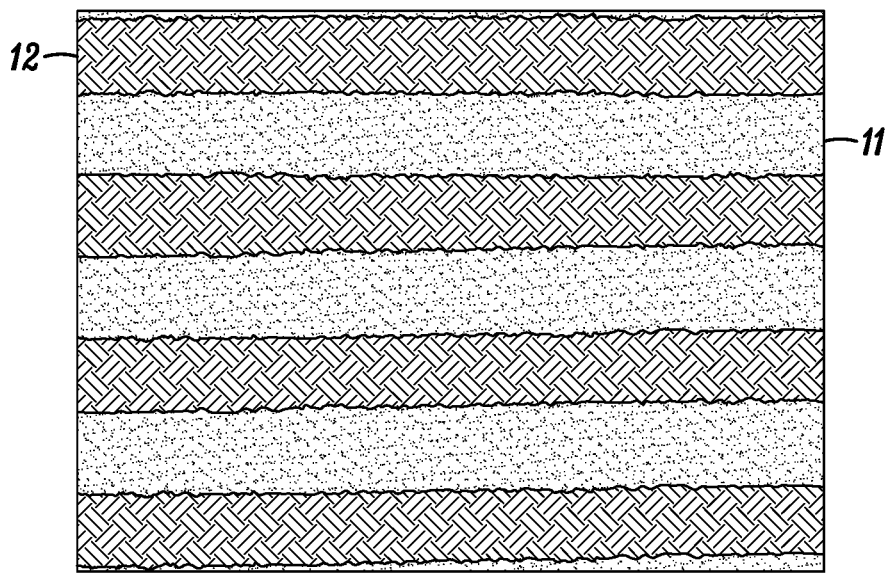
FIG. 1B shows strips of silver printed and cured on a composite treated substrate of the invention, i.e., a thermoplastic polyurethane film with a polyurethane coating formed from a water-based polyurethane dispersion.

Comparative Experiment C was carried out as described for Example 3 except that untreated polyurethane film was used, i.e. there was no corona treatment or polyurethane coating. The resistivity for the same silver paste screen printed on the untreated polyurethane was also 58 mohm/sq/mil. However, 18% of the parts printed on the untreated film failed resistance testing as open circuits. Treated film yielded no failed parts. As seen in FIG. 1A the untreated polyurethane 1 has silver prints 2 that contain many pinhole defects 3. For clarity only two such pinholes have been denoted but numerous other pinholes are evident. As seen in FIG. 1B the treated polyurethane 11 has silver prints 12 that show more uniform silver coverage.

Example 4 and Comparative Example D

For Example 4, a 1 mil film of an ester based, high stretch recovery thermoplastic polyurethane with a durometer of 74 A, and a melt point of 150° C. was mounted on a polypropylene carrier with a 3 mil melt adhesive. The exposed surface of the polyurethane film was subjected to a corona treatment of 5 kw/cm$^2$ and an aqueous-based dispersion was used to apply a polyurethane coating at a rate of 1 g of coating per square meter of polyurethane film in a roll-to-roll process. The coating was cured at between 80° C. and 110° C. for 30 seconds. DuPont™ PE873 conductive, elastic silver paste was screen printed onto the treated surface and cured at 130° C. for 15 min. The 6" gauge length silver prints were repeatedly stretched between 0% and 40% strain at a rate of 20 in/min, 300 times. Resistance of the specimens was measured by a four-point probe method continuously during the stretching. The maximum and minimum resistance in each 0%-40%-0% cycle was recorded.

Comparative Experiment D was carried out as described for Example 4 except that untreated polyurethane film was used, i.e. there was no corona treatment or polyurethane coating. The silver prints were subjected to the same strain procedure and resistance measurements as those on the treated surface.

Figure 2:
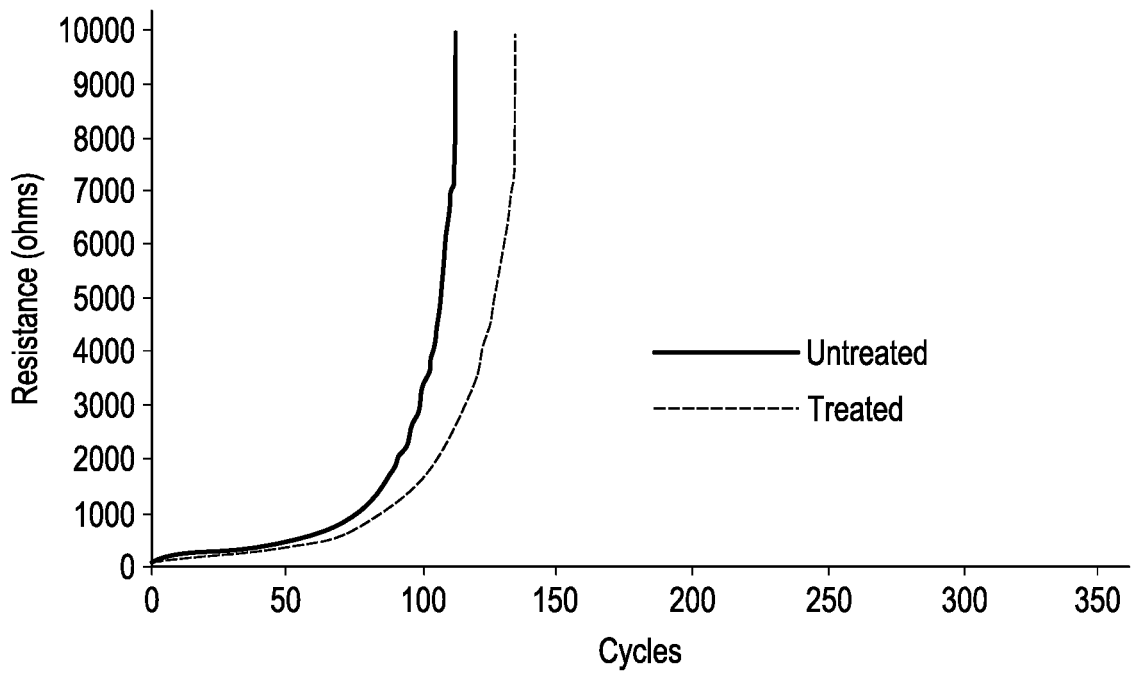
FIG. 2 shows the maximum resistance of silver conductors screen-printed on untreated and treated substrates in each 0%-40%-0% strain cycle as a function of the number of subsequent cycles of stretch.
Figure 3:
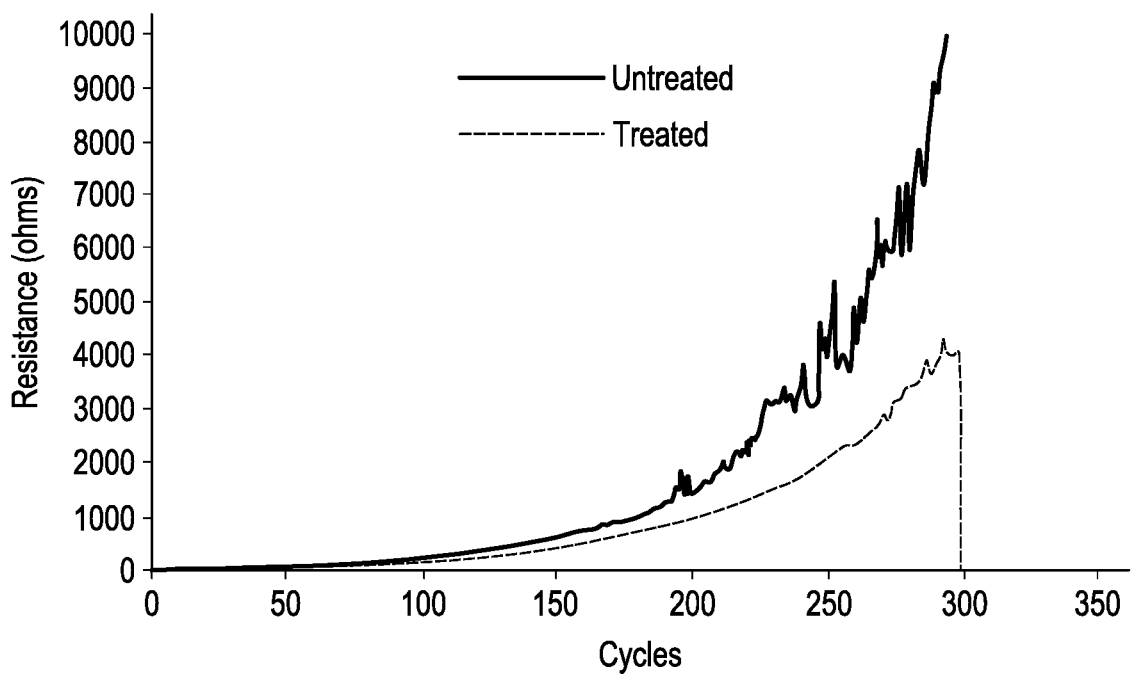
FIG. 3 shows the minimum resistance of silver conductors screen-printed on untreated and treated substrates in each 0%-40%-0% strain cycle as a function of the number of subsequent cycles of stretch.

The maximum and minimum resistance in each strain cycle for the silver on the treated surface and that on the untreated surface is shown in FIGS. 2 and 3. Maximum resistance increases more slowly with cycle number for the silver on the treated surface than for the silver on the untreated surface. Minimum resistance in each cycle also increases more slowly in the treated sample and, unlike the untreated sample, the resistance of the treated sample recovers to a resistance of less than 100 ohms.

What is claimed is:
1. An article comprising:
  a. a thermoplastic elastomer polymer film, wherein the polymer of the thermoplastic elastomer polymer film is selected from the group consisting of thermoplastic polyurethane, thermoplastic polyester and thermoplastic polyether;
  b. a thermoplastic elastomer coating on one side of the polymer film wherein the thermoplastic elastomer coating is a polyurethane, wherein there is between 1 and 50 g of coating per square meter of polymer film and wherein the coating has been formed from a water-based dispersion; and
  c. an elastic, electrical conductor deposited on the coating.
2. The article of claim 1, wherein the elastic, electrical conductor is formed from a polymer thick film silver paste.
3. The article of claim 1, wherein the side of the polymer film without the coating is adhered to a carrier film comprising polypropylene, polyethylene terephthalate (PET), silicone treated paper, a polypropylene/polyethylene copolymer or polyvinyl fluoride.
4. A composite substrate comprising:
  a) a thermoplastic elastomer polymer film, wherein the polymer of the thermoplastic elastomer polymer film is selected from the group consisting of thermoplastic polyurethane, thermoplastic polyester and thermoplastic polyether; and
  b) a thermoplastic elastomer coating on one side of the polymer film wherein the thermoplastic elastomer coating is polyurethane, wherein there is between 1 and 50 g of coating per square meter of polymer film and wherein the coating has been formed from a water-based dispersion.
5. The composite substrate of claim 4, wherein the polymer film has been subjected to corona or plasma treatment prior to the deposition of the polyurethane coating.

6. The composite of claim 4, wherein the side of the polymer film without the coating is adhered to a carrier film comprising polypropylene, polyethylene terephthalate (PET), silicone treated paper, a polypropylene/polyethylene copolymer or polyvinyl fluoride.

\* \* \* \* \*